United States Patent
Mori et al.

(10) Patent No.: US 8,896,172 B2
(45) Date of Patent: Nov. 25, 2014

(54) SUBSTRATE SUPPORT STRUCTURE

(75) Inventors: Kazuaki Mori, Kumagaya (JP);
Hideyuki Takahashi, Gyoda (JP);
Kaoru Tanaka, Sano (JP); Tomohiro Kawabata, Sano (JP); Yuki Hayakawa, Shiraoka (JP)

(73) Assignee: Calsonic Kansei Corporation, Saitama-shi (JP)

( * ) Notice: Subject to any disclaimer, the term of this patent is extended or adjusted under 35 U.S.C. 154(b) by 745 days.

(21) Appl. No.: 13/132,014

(22) PCT Filed: Nov. 26, 2009

(86) PCT No.: PCT/JP2009/069917
§ 371 (c)(1),
(2), (4) Date: May 31, 2011

(87) PCT Pub. No.: WO2010/067714
PCT Pub. Date: Jun. 17, 2010

(65) Prior Publication Data
US 2011/0234032 A1    Sep. 29, 2011

(51) Int. Cl.
*H02K 5/22*        (2006.01)
*H05K 7/14*        (2006.01)

(52) U.S. Cl.
CPC ..................... *H05K 7/142* (2013.01)
USPC .................. 310/89; 310/83; 310/91; 361/809

(58) Field of Classification Search
CPC ........ H05K 7/142; H05K 7/1417; F16B 5/06; F16B 5/0096; H02K 11/0068; H02K 11/0078; H02K 11/0073; H02K 11/0084; H02K 5/22
USPC ............ 361/756, 807, 809; 174/138 E, 138 G
See application file for complete search history.

(56) References Cited

U.S. PATENT DOCUMENTS 7,306,159 B1 * 12/2007 Rochelo ..................... 235/492
7,586,302 B2 * 9/2009 Choi et al. .............. 324/207.25
2012/0014625 A1   1/2012 Igarashi et al.

FOREIGN PATENT DOCUMENTS

JP        62-87492 U      6/1987
JP        07-030265 A     1/1995
(Continued)

OTHER PUBLICATIONS

Yamamoto, JP08145019 Machine Translation, Jun. 1996.*
(Continued)

*Primary Examiner* — Burton Mullins
*Assistant Examiner* — Eric Johnson
(74) *Attorney, Agent, or Firm* — Foley & Lardner LLP (57) ABSTRACT

[Object] An object of the present invention is to provide a substrate support structure which can prevent a crush rib from damaging components other than a substrate and brings excellent workability.
[Means to solve] In a substrate support structure, a box-shaped resinous case 2 provided with a holding space section 23 is separated into a first case 21 and a second case 22, and a substrate 3 is housed in the holding space section 23. A first crush rib 41 and a second crush rib 42 are provided in the second case 22, and press and fix the substrate 3 to first case 21 by reaction force that is generated by being pressed against the substrate 3 and crushed when the both cases 21, 22 are joined together. A first guide 51 is provided in the first case 21, and guides the first crush rib 41 to the substrate 3 mounted in the first case 21 when the both cases 21, 22 are joined together. A second guide 52 is provided in the first case 21, and guides the second crush rib 42 to the substrate 3 when the both cases 21, 22 are joined together.

6 Claims, 7 Drawing Sheets

(56) References Cited

FOREIGN PATENT DOCUMENTS

| JP | 07-21418 U | 4/1995 |
|---|---|---|
| JP | 07-245489 A | 9/1995 |
| JP | 08-078861 A | 3/1996 |
| JP | 08-145019 A | 6/1996 |
| JP | 08-335785 A | 12/1996 |
| JP | 2005-005168 A | 1/2005 |
| JP | 2005-073407 A | 3/2005 |
| JP | 2006066623 A * | 3/2006 |
| JP | 2007-123749 A | 5/2007 |
| JP | 2007192349 A * | 8/2007 |

OTHER PUBLICATIONS

Takahashi et al., JP2007192349 Machine Translation, Aug. 2007.*
Office Action received Apr. 3, 2014 in Australian Patent Application No. 2011260914.

* cited by examiner

SUBSTRATE SUPPORT STRUCTURE

TECHNICAL FIELD

The present invention relates to a substrate fixing structure that fixes a substrate between resinous cases, and relates to a technique favorable to use for an actuating system etc. that actuates a door of an air conditioning system for a vehicle.

BACKGROUND ART

Conventionally, as a technique for housing and fixing the substrate in a holding space section of the case, a technique, in which the substrate is pressed against a crush rib that is formed integrally with the case and the crush rib is crushed then the substrate is fixed by its reaction force, has been known by a Patent Document 1.

In addition, in a configuration in which the substrate, the actuator etc. are housed in the holding space section that is formed by joining a first case and a second case, when joining the both cases together, the substrate mounted on the first case is pressed against by the crush rib that protrudes from the second case, and the crush rib is crushed, thereby fixing the substrate.

Patent Document 1: Japanese Patent Application Kokai Publication No. 2005-5168

SUMMARY OF THE INVENTION

Problems Solved by the Invention

However, in the technique in which the substrate is pressed against by the crush rib as described above, in a case where a distance between the substrate supported by the first case and the second case is long, a length of the crush rib becomes long.

For this reason, there is a risk that when joining the first and second cases together, the long length of the crush rib will touch components other than the substrate before touching the substrate, and the other components will be damaged in the worst case. Additionally, to prevent this risk, careful work is done. Workability therefore deteriorates.

The present invention is the one that has been made with the above conventional problems taken into consideration. And an object of the present invention is to provide a substrate support structure which can prevent the crush rib from damaging the components other than the substrate and brings excellent workability.

Means to Solve the Problems

In order to achieve the above object, in the present invention, a substrate support structure has: a case having a first case and a second case, a holding space section that houses therein a substrate being formed in the case; a crush rib provided in the second case, the crush rib pressing and fixing the substrate to the first case by reaction force that is generated by being pressed against the substrate and crushed when the both cases are joined together; and a guide provided in the first case, the guide guiding the crush rib to the substrate mounted in the first case when the first case and the second case are joined together.

In the above substrate support structure, the crush rib has a thin plate body part and an orthogonal part that extends from the body part in a direction substantially orthogonal to the body part, and the guide has a body part guide portion that guides the body part while restraining relative movement in a thickness direction of the body part and an orthogonal part guide portion that is substantially orthogonal to the body part guide portion and guides the orthogonal part while restraining relative movement in a thickness direction of the orthogonal part.

In the above substrate support structure, the crush rib has a pair of orthogonal parts that form a substantially H-shape in cross section together with the body part, and the guide is provided with a sandwiched part that is sandwiched and supported between and by a pair of the orthogonal parts.

In the above substrate support structure, the crush rib and the guide are provided in the middles of the second case and the first case respectively, which are away from a circumferential wall that encloses the holding space section.

In the above substrate support structure, the first case has the holding space section in which the substrate is mounted, the crush rib protrudes toward the first case in the second case, the guide is formed in a position where the crush rib is inserted, in the first case, and when the both cases are joined together, the crush rib is inserted into the guide and is guided up to the substrate before entering the holding space section of the first case.

In the above substrate support structure, at least a pair of the crush ribs and at least a pair of the guides are provided, and the crush ribs and the guides of the each pair are positioned at diagonal corners of the substrate, which are symmetrical about a center of the substrate.

In the above substrate support structure, a motor, a speed-reduction mechanism that decelerates a rotation of the motor and an output shaft that transmits the decelerated motor rotation to an outside of the case are mounted in the holding space section, and at least a pair of the crush ribs and at least a pair of the guides are respectively provided in diagonal positions with respect to the output shaft.

Effects of the Invention

In the above substrate support structure of the present invention, after mounting the substrate and the other components in the first case, the second case is joined to the first case. At this time, the crush rib provided in the second case reaches the substrate while being guided by the guide provided in the first case, and the crush rib is crushed by being pressed against the substrate, the substrate is then fixed to the case by its reaction force.

In this way, since the crush rib reaches the substrate by being guided by the guide, there is no risk that the crush rib will touch components other than the substrate before reaching the substrate and the other components will be damaged. In addition, this allows smooth work, and the workability is improved.

Further, in the present invention, when joining the first and second cases together, the body part of the crush rib is guided by the body part guide portion of the guide with relative movement in a thickness direction of the body part restrained, also the orthogonal part of the crush rib is guided by the orthogonal part guide portion of the guide with relative movement in a thickness direction of the orthogonal part restrained.

Therefore, in a joining state of the case, relative displacement in a plane direction orthogonal to an extending direction of the crush rib is restrained by the crush rib and the guide. Position restraining performance when the both cases are relatively moved and guided is thus improved. Further, after the assembling, relative movement of the first case and the second case is restrained in two directions orthogonal to the extending direction of the crush rib, and rigidity of the case is improved.

In addition, in the present invention, the crush rib has a portion that forms the substantially H-shape in cross section by a pair of the orthogonal parts, and the sandwiched part of the guide is sandwiched by this portion. Thus, relative movement in all directions on the plane orthogonal to the extending direction of the crush rib is restrained, and the position restraining performance when the both cases are relatively moved and guided is further improved. Also, after the assembling, the rigidity of the case is further improved.

Furthermore, in the present invention, since the crush rib and the guide are located in the middle that is away from the circumferential wall of the each case, relative movement of the portion that is away from the circumferential wall of the case is restrained, and the rigidity of the case is further improved.

Moreover, in the present invention, when the both cases are joined together, the crush rib is inserted into the guide and is guided up to the substrate before entering the holding space section of the first case. Consequently, the crush rib is surely guided up to the substrate without interfering with the other components housed in the holding space section before reaching the substrate, and the substrate can be fixed. Also damage to the other components by the interference can be avoided, and the workability is improved.

In addition, in the present invention, at least a pair of the crush ribs and at least a pair of the guides are provided, and the crush ribs and the guides of the each pair are positioned at diagonal corners of the substrate, which are symmetrical about the center of the substrate. Therefore, the substrate can be surely fixed.

Additionally, in the present invention, since the crush ribs and the guides are provided in diagonal positions with respect to the output shaft, prevention of deformation of the case when a load is put on the output shaft is effectively made, and torsion rigidity of the case is improved.

DESCRIPTION OF THE EMBODIMENTS

In the following description, embodiments of the present invention will be explained on the basis of the drawings. A substrate support structure of an embodiment of the present invention has a case (2) having a first case (21) and a second case (22), a holding space section (23) that houses therein a substrate (3) being formed in the case (2); a crush rib (41; 42) provided in the second case (22), the crush rib (41; 42) pressing and fixing the substrate (3) to the first case (21) by reaction force that is generated by being pressed against the substrate (3) and crushed when the both cases (21, 22) are joined together; and a guide (51; 52) provided in the first case (21), the guide (51; 52) guiding the crush rib (41; 42) to the substrate (3) mounted in the first case (21) when the first case (21) and the second case (22) are joined together.

Embodiment 1

In the following description, a substrate support structure of an embodiment 1 of the best mode of the present invention will be explained on the basis of FIGS. 1~6.

Figure 1:
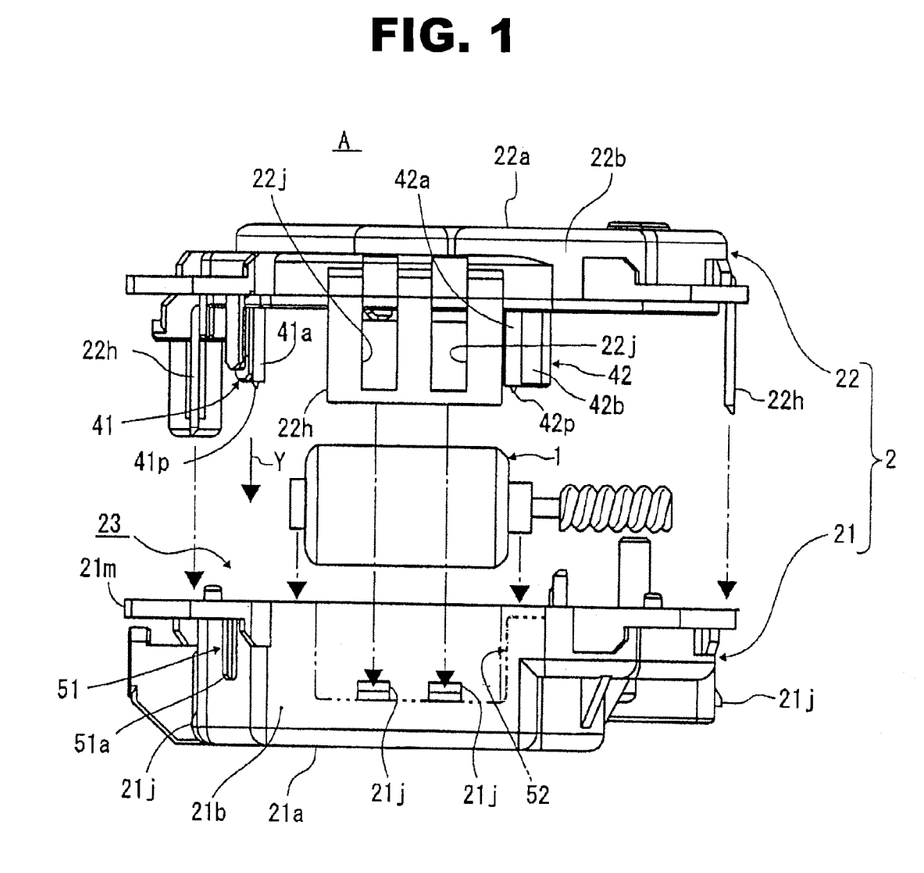
FIG. 1 is a side view, with a first case 21 and a second case 22 separated, of an actuating system A that employs a substrate support structure of an embodiment 1 of the best mode of the present invention.

The substrate support structure of this embodiment 1 is the one that is applied to an actuating system A that rotates an air-mix door etc. of an air conditioning system for a vehicle. As shown in FIG. 1, the substrate support structure has a motor 1 and a box-shaped resinous case 2 that houses therein this motor 1.

The case 2 is separated into a first case 21 and a second case 22 shown in the drawing. The case 2 houses the motor 1, a speed-reduction mechanism (not shown) and a substrate 3 (see FIG. 6) in a holding space section 23 that is formed between the both cases with the both cases joined together. That is, the actuating system A is configured to decelerate a rotation of the motor 1 by the speed-reduction mechanism (not shown) and output the decelerated rotation to an outside of the case 2 through an output shaft (not shown).

Figure 2:
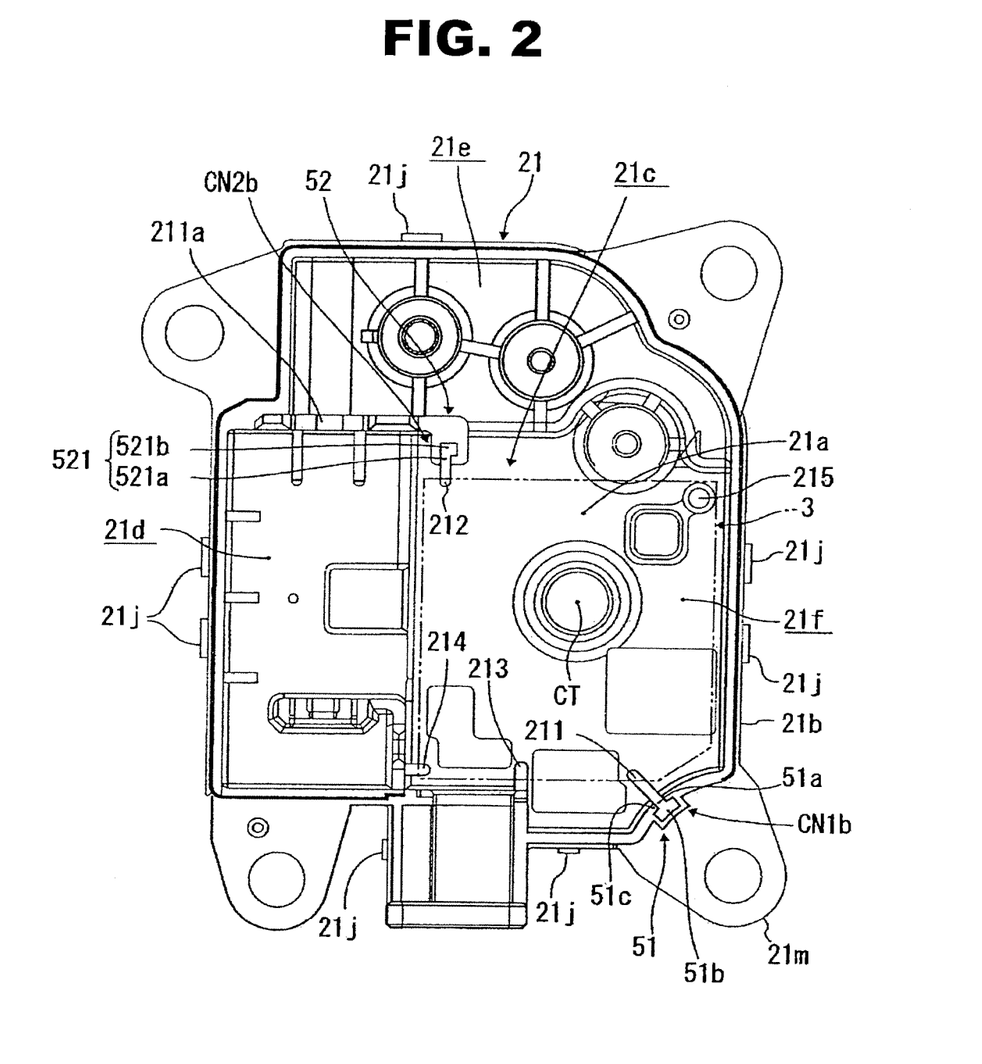
FIG. 2 is a plan view showing the first case 21 used in the substrate support structure of the embodiment 1.

As shown in FIGS. 1 and 2, the first case 21 is formed into a substantially hollow shape with a circumference of a lower cover plate 21a enclosed with a circumferential wall 21b. The first case 21 has a first space section 21c on an inner side of the circumferential wall 21b.

FIG. 2 is a plan view, viewed from above, of the first case 21 shown in FIG. 1. The first space section 21c has a first motor holding section 21d that houses therein the motor 1, a first speed-reduction mechanism holding section 21e that houses therein the speed-reduction mechanism having a plurality of gears (not shown) and a first substrate holding section 21f that houses therein the substrate 3.

Figure 3:
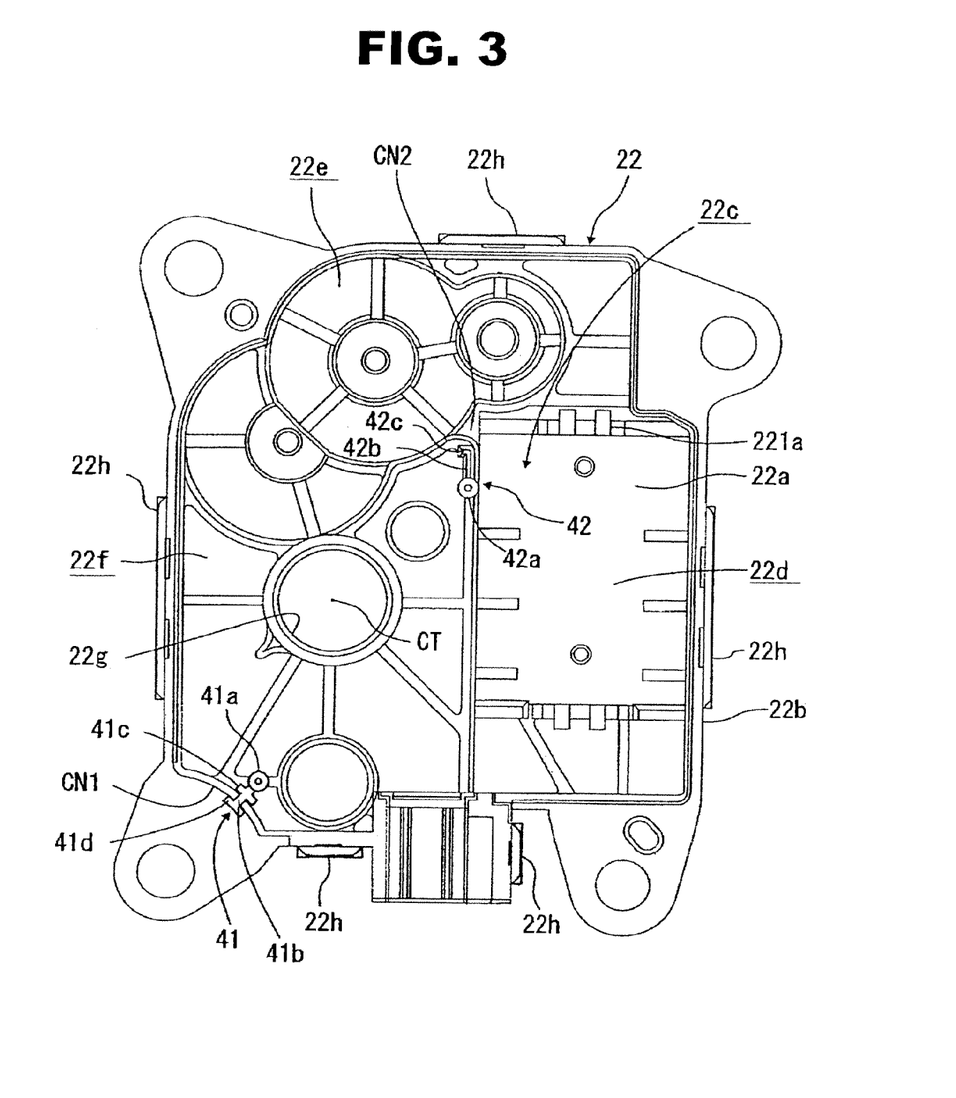
FIG. 3 is a bottom view showing the second case 22 used in the substrate support structure of the embodiment 1.

As shown in FIGS. 1 and 3, the second case 22 is formed into a substantially hollow shape with a circumference of an upper cover plate 22a enclosed with a circumferential wall 22b. The second case 22 has s second space section 22c on an inner side of the circumferential wall 22b.

FIG. 3 is a bottom view, viewed from the bottom side, of the second case 22 shown in FIG. 1. The second case 22 has a second motor holding section 22d that houses therein the motor 1, a second speed-reduction mechanism holding section 22e that houses therein the speed-reduction mechanism having a plurality of the gears (not shown) and a second substrate holding section 22f that houses therein the substrate 3. Here, on the upper cover plate 22a at the second substrate holding section 22f, an output shaft opening 22g where the output shaft (not shown) penetrates and protrudes from the case 2 opens.

By joining the first case 21 and the second case 22 together, the holding space section 23 where the first space section 21c and the second space section 22c are connected is formed.

Next, a joining structure of the first case 21 and the second case 22 will be briefly explained.

A plurality of connecting portions 22h hang down from the second case 22 in a downward direction in FIG. 1. On each of these connecting portions 22h, a substantially rectangular narrow engaging hole 22j opens along an extending direction of the connecting portion 22h.

On the other hand, on an outside surface of the circumferential wall 21b of the first case 21, a plurality of engaging protrusions 21j that protrude outward are formed so as to be able to engage with the respective engaging holes 22j.

Therefore, when moving the second case 22 in the downward direction in FIG. 1, the connecting portion 22h gets over the engaging protrusion 21j while elastically deforming in an outward direction of the circumferential wall 21b. Then, at a point when the engaging hole 22j reaches a position of the engaging protrusion 21j, the connecting portion 22h returns to the original hanging state, and the engaging hole 22j and the engaging protrusion 21j are brought to the engaging state, the both cases 21, 22 are thus joined together.

Next, a structure that fixes the substrate 3 to the case 2 will be explained.

The structure of the present embodiment is the one by which the substrate 3 is fixed with two points of the substrate 3 pressed against by two crush ribs 41, 42 of a first crush rib 41 and a second crush rib 42.

The both crush ribs 41, 42 are fixedly formed in the second case 22. As shown in FIG. 1, the crush ribs 41, 42 extend downward with respect to a lower end of the circumferential wall 22b. Also, as shown in FIG. 3, the crush ribs 41, 42 are positioned in diagonal two positions of the second substrate holding section 22f whose plane shape is substantially rectangular shape with the output shaft (not shown) being a center (CT) in the second case 22.

The first crush rib 41 is provided at a corner part CN1 which is the corner part of the second substrate holding section 22f and also the corner part of the second case 22.

Figure 4:
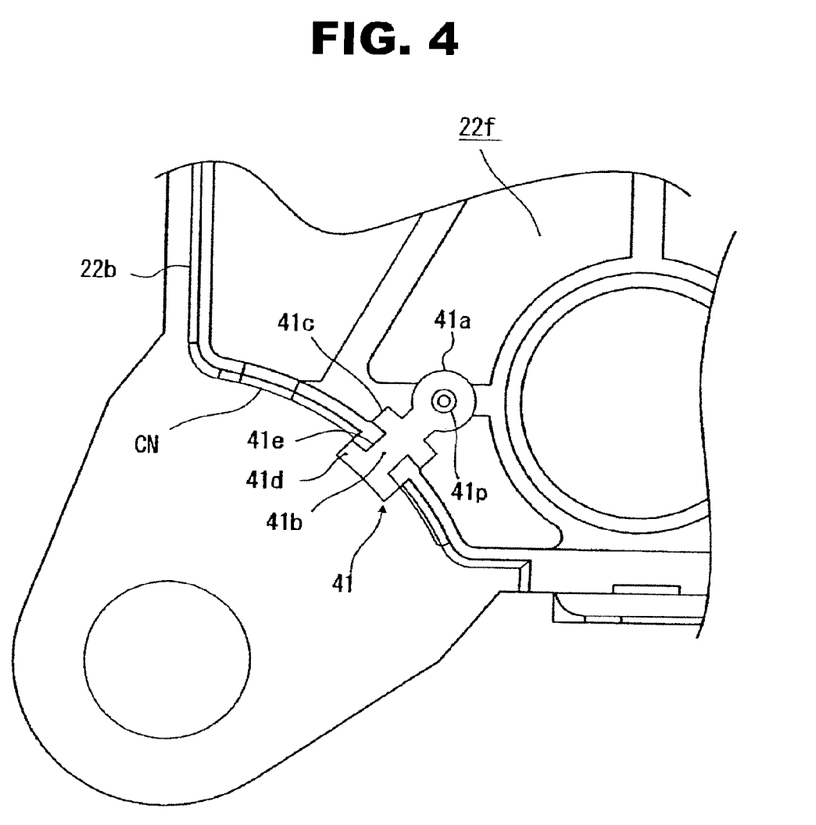
FIG. 4 is an enlarged bottom view showing a first crush rib 41 of a principal part of the substrate support structure of the embodiment 1.

As shown in FIG. 4, the first crush rib 41 has a cylindrical body column portion 41a, a substantially rectangular thin plate body part 41b which is formed integrally with this body column portion 41a and is substantially orthogonal to the circumferential wall 22b also penetrates the circumferential wall 22b, a substantially rectangular thin plate first orthogonal part 41c which is formed integrally with this body part 41b and is substantially orthogonal to the body part 41b in the middle of the body part 41b also is located along an inside surface of the circumferential wall 22b, and a second orthogonal part 41d which is formed integrally with an edge portion of the body part 41b so as to be substantially parallel to the first orthogonal part 41c and orthogonal to the body part 41b also to be located along an outside of the circumferential wall 22b. Further, a sandwich gap portion 41e is provided between the first orthogonal part 41c and the second orthogonal part 41d.

A crush pin 41p that is pressed and crushed is provided at a top portion, in an axial direction, of the body column portion 41a. As shown in FIG. 1, the crush pin 41p protrudes downward from the body column portion 41a.

The second crush rib 42 is provided at a boundary portion between the second substrate holding section 22f, the second motor holding section 22d and the second speed-reduction mechanism holding section 22e, which is a corner part CN2 of the second substrate holding section 22f and the middle of the second case 22.

Figure 5:
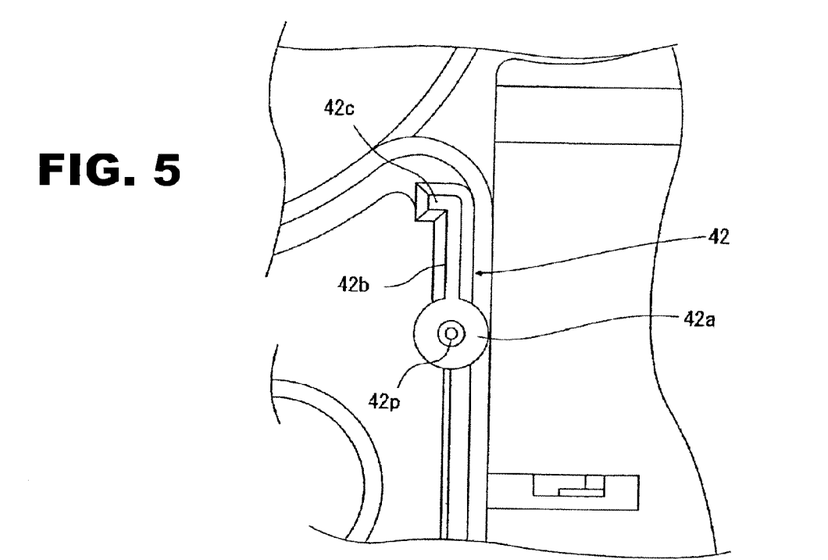
FIG. 5 is an enlarged bottom view showing a second crush rib 42 of a principal part of the substrate support structure of the embodiment 1.

As shown in FIG. 5, this second crush rib 42 has a cylindrical body column portion 42a, a substantially rectangular thin plate body part 42b that extends toward the corner part CN2 along the boundary between the second substrate holding section 22f and the second motor holding section 22d from the body column portion 42a, and an orthogonal part 42c that is substantially orthogonal to the body part 42b at a top end portion of the body part 42b so as to be located along the corner part CN2 at the corner part CN2. A crush pin 42p that is pressed and crushed is provided at a top portion, in an axial direction, of the body column portion 42a.

The first case 21 is provided with a first guide 51 and a second guide 52 which slide and guide the first crush rib 41 and the second crush rib 42 respectively in an arrow Y direction shown in FIG. 1.

The first guide 51 is provided at a corner part CN1b that is fitted to the corner part CN1 of the second case 22 at the circumferential wall 21b. The first guide 51 has a body part guide groove (a body part guide portion) 51a and a second orthogonal part guide hole (an orthogonal part guide portion) 51b.

As shown in FIG. 1, the body part guide groove 51a is a groove that is formed in a vertical direction along the circumferential wall 21b. This groove width is set to a size that is able to slide the body part 41b of the first crush rib 41 in up-and-down directions, also this groove depth is formed so that even when the both cases 21, 22 are joined, the body part 41b does not strike the body part guide groove 51a.

As shown in FIG. 2, the second orthogonal part guide hole 51b is formed into a rectangular shape so as to continue to the body part guide groove 51a and to form a substantially T-shape in an outside position of the circumferential wall 21b by cutting a part of a screw-stopper engagement flange 21m that expands outward from the circumferential wall 21b. A size of the second orthogonal part guide hole 51b is formed so that the second orthogonal part 41d of the first crush rib 41 can be inserted in the up-and-down directions.

Here, a sandwiched part 51c that is sandwiched and supported by a pair of the orthogonal parts 41c, 41d is formed by an edge portion formed along the body part guide groove 51a at the circumferential wall 21b.

Figure 6:
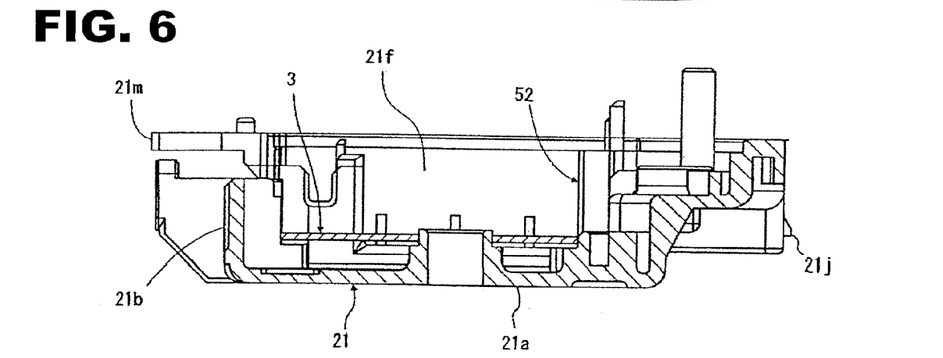
FIG. 6 is a sectional view of the first case 21 of a principal part of the substrate support structure of the embodiment 1.

The second guide 52 is provided at a corner part CN2b of the first substrate holding section 21f which is fitted to the corner part CN2 of the second case 22, which is the middle of the first case 21. Further, as shown in FIG. 6, the second guide 52 stands with its height being substantially equal to the circumferential wall 21b.

In addition, the second guide 52 is provided with a guide groove 521 shown in FIG. 2 along the up-and-down directions. As can be seen in the drawing, this guide groove 521 is formed into a substantially L-shape in cross section. The guide groove 521 has a body part guide portion 521a which is a groove entry portion and is formed slightly wider than the body part 42b of the second crush rib 42 so as to be able to guide the body part 42b and an orthogonal part guide portion 521b which is substantially orthogonal to the body part guide portion 521a at a groove back side portion and is formed slightly wider than the orthogonal part 42c so as to be able to guide the orthogonal part 42c.

Here, a base end portion of the first guide 51 and a base end portion of the second guide 52 are respectively provided with supporting protrusions 211, 212 which are located at inner sides of the second orthogonal part guide hole 51b and the orthogonal part guide portion 521b respectively. These supporting protrusions 211, 212 are located so as to be able to support a circumferential edge portion of a back surface of the substrate 3 together with the other supporting protrusions 213, 214, 215. The supporting protrusions 211, 212 formed so as to continue to the first guide 51 and the second guide 52 respectively are located in positions in which the supporting protrusions 211, 212 match the crush pins 41p, 42p of the both crush ribs 41, 42 in the axial direction when the both cases 21, 22 are joined together.

Next, the working of the embodiment 1 will be explained.

After mounting the motor 1, the substrate 3, the speed-reduction mechanism (not shown), etc. in the first case 21, the second case 22 is joined to the first case 21. At this time, the top portions of the first crush rib 41 and the second crush rib 42 provided in the second case 22 are respectively inserted into the first guide 51 and the second guide 52 provided in the first case 21.

That is, the body part 41b of the first crush rib 41 is inserted into the body part guide groove 51a. Further, the first orthogonal part 41c is set along an inside of the circumferential wall 21b, and the second orthogonal part 41d is inserted into the second orthogonal part guide hole 51b, also the circumferential edge portion of the body part guide groove 51a at the circumferential wall 21b is fitted to the sandwich gap portion 41e between the both orthogonal parts 41c, 41d.

At this time, the first crush rib 41 extends downward with respect to the lower end of the circumferential wall 22b of the second case 22, also an opening end of the body part guide groove 51a and the second orthogonal part guide hole 51b are provided at a top of the circumferential wall 21b of the first case 21. Therefore, at a point before the first crush rib 41 enters the first space section 21c that is located below the circumferential wall 21b of the first case 21, the first crush rib 41 is inserted into the body part guide groove 51a and the second orthogonal part guide hole 51b. Accordingly, it is possible to move the first crush rib 41 in the holding space section 23 without interfering with the components etc. of the speed-reduction mechanism housed in the first space section 21c.

Likewise, also the second crush rib 42 extends downward with respect to the lower end of the circumferential wall 22b of the second case 22, and an opening end of the body part guide portion 521a and an opening end of the orthogonal part guide portion 521b are provided at the top of the circumferential wall 21b of the first case 21. Thus, at a point before the second crush rib 42 enters the first space section 21c located below the circumferential wall 21b of the first case 21, also the second crush rib 42 is inserted into the both guide grooves 521a, 521b. Hence, it is possible to move the second crush rib 42 in the holding space section 23 without interfering with the components etc. of the speed-reduction mechanism housed in the first space section 21c.

Subsequently, when moving the crush ribs 41, 42 along the guides 51, 52 respectively, the crush pins 41p, 42p of the top portions of the body column portions 41a, 42a of the crush ribs 41, 42 reach the substrate 3. Further, when relatively moving the both cases 21, 22 up to a position in which the engaging hole 22j and the engaging protrusion 21j are brought to the engaging state, each of the crush pins 41p, 42p is pressed and crushed, then the substrate 3 is firmly fixed to the case 2 by its reaction force with the substrate 3 sandwiched and supported between the crush ribs 41, 42 and the supporting protrusions 211, 212, 213, 214, 215.

As explained above, since each of the crush ribs 41, 42 reaches the substrate 3 by being guided by the respective guides 51, 52, the crush ribs 41, 42 do not touch the other components before reaching the substrate 3, and the risk of damaging the components by this touch can be avoided. In addition, this allows smooth work, and the workability is improved.

In a joining state of the first case 21 and the second case 22, relative movement in a thickness direction of the body part 41b and in a thickness direction of the both orthogonal parts 41c, 41d of the first crush rib 41 is restrained by the body part guide groove 51a and the second orthogonal part guide hole 51b of the first guide 51 and an inside surface and the outside surface of the circumferential wall 21b, in two directions which are orthogonal to each other on a horizontal plane orthogonal to the up-and-down direction that is an extending direction of the first crush rib 41 and form angles of approx. 45° with respect to the substantially rectangular shape that forms the circumferential walls 21b, 22b.

Consequently, same as a case where a stiffening flange is provided at the circumferential walls 21b, 22b of the case 2, rigidity of the case 2 is improved, and rigidity of the circumferential walls 21b, 22b especially is improved.

Further, with regard to the first crush rib 41, the first and second orthogonal parts 41c, 41d are formed so as to sandwich and support the circumferential edge portion of the body part guide groove 51a of the circumferential wall 21b. Therefore, relative movement in all directions on the horizontal plane orthogonal to the extending direction of the first crush rib 41 is restrained. Guiding performance when joining the both cases 21, 22 is thus further improved, and the rigidity of the case 2 is further improved after the assembling.

Furthermore, likewise, with respect to the second crush rib 42 and the second guide 52, movement in a thickness direction of the body part 42b and in a thickness direction of the orthogonal part 42c relative to the first case 21 and the second case 22 is restrained by the body part guide portion 521a and the orthogonal part guide portion 521b.

Therefore the rigidity of the case 2 is improved. In particular, since the second crush rib 42 and the second guide 52 are joined together in the middle of the case 2, the rigidity of the middle of the case 2 which is away from the circumferential walls 21b, 22b is improved.

Moreover, in the embodiment 1, the first crush rib 41 and the second crush rib 42, the first guide 51 and the second guide 52 are located in the diagonal positions of the center CT of the output shaft (not shown). Thus, prevention of deformation of the case 2 when a load is put on the output shaft is effectively made, and torsion rigidity of the case 2 against the load on the output shaft is improved.

In addition, in the embodiment 1, regarding the first guide 51, the body part guide groove 51a is formed by cutting a part of the circumferential wall 21b. This is unfavorable for sealing performance of the holding space section 23. However, since the structure, in which the first orthogonal part 41c and the second orthogonal part 41d are formed in the first crush rib 41 and also the first crush rib 41 is fitted to or contiguous to the inside and outside of the circumferential wall 21b of the circumferential edge portion of the body part guide groove 51a by the both orthogonal parts 41c, 41d, is employed, the sealing performance can be ensured. It is therefore possible to ensure the sealing performance without requiring any special sealing member.

Although the present invention and the embodiment 1 have been described above with reference to the drawings, the invention is not limited to the embodiment 1. Modifications and variations of the embodiment will occur to those skilled in the art in light of the above teachings.

For example, the embodiment shows the case where the present invention is used for the fixing of the substrate 3 mounted in the actuating system that rotates the air-mix door of the air conditioning system for the vehicle. However, the present invention can be used in equipment for the vehicle such as a meter device, industrial equipment except the vehicle, electrical equipment, etc. without being limited to the actuating system, as long as the equipment is the one in which the substrate is fixed to the resinous case.

Further, the embodiment 1 shows the case where the crush ribs and the guides are respectively provided in two positions. However, the number of the crush ribs and the number of the guides are not limited to two. Each of the crush rib and the guide could be provided in at least one position, or might be provided in a plurality of positions which is three positions or more.

Furthermore, in the embodiment 1, as the crush rib and the guide, the first crush rib 41 and the first guide 51 which are provided along the circumferential wall and the second crush rib 42 and the second guide 52 which are provided in the middle of the case 2 are shown. However, as the setting positions of the crush rib and the guide, they could be either the vicinity of the circumferential wall or the middle of the case which is away from the circumferential wall. Or, even in a case where a plurality of the crush ribs and the guides are provide, the setting positions could be only either one of the vicinity of the circumferential wall or the middle.

Figure 7A:
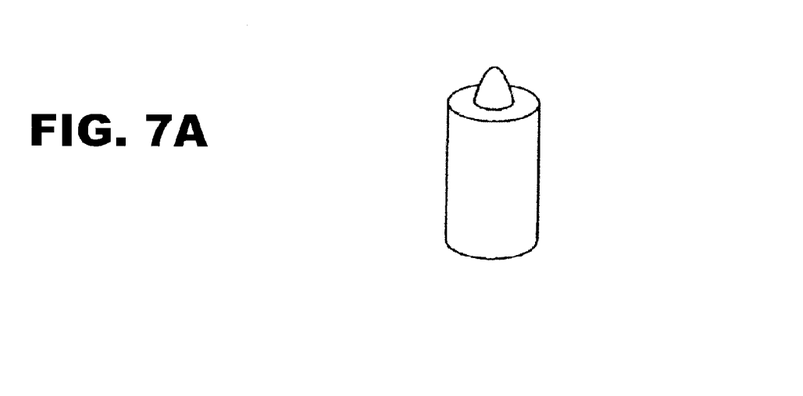
FIG. 7A is a perspective view showing a column portion of the other embodiment.
Figure 7B:
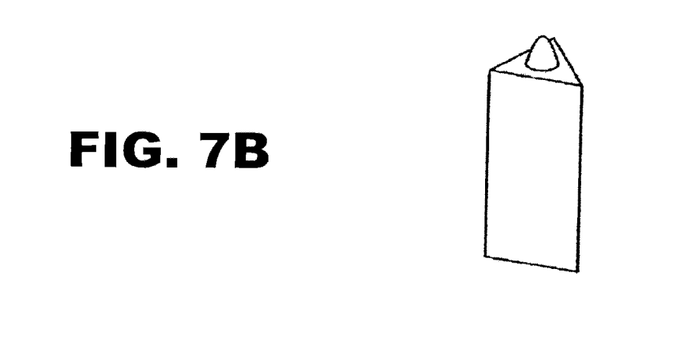
FIG. 7B is a perspective view showing a column portion of the other embodiment.
Figure 7C:
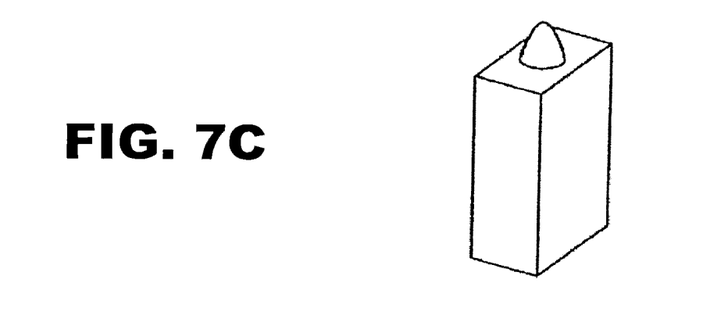
FIG. 7C is a perspective view showing a column portion of the other embodiment.

In addition, in the embodiment 1, as the crush rib, the first crush rib 41 having an H-shaped portion and the second crush rib 42 having a substantially L-shape are shown. However, the shape is not limited to these shapes. For instance, as shown in FIG. 7A, it could be a cylindrical column that corresponds to only the body column portions 41a, 42a of the embodiment 1. Or other polygonal columns shown in FIGS. 7B and 7C might be possible.

Figure 8A:
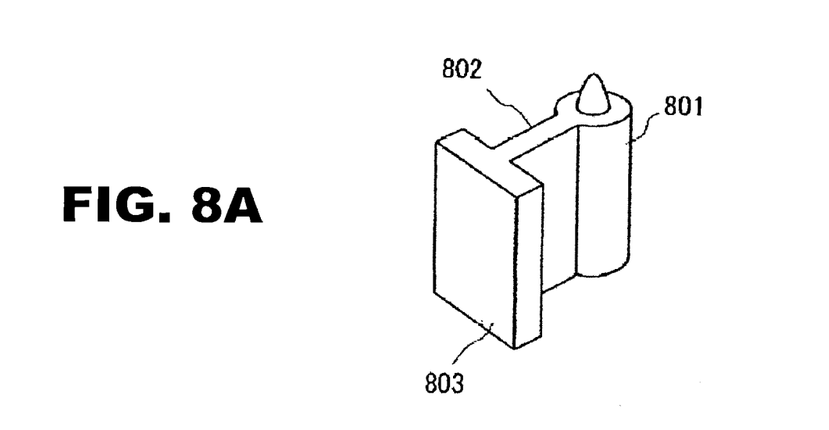
FIG. 8A is a perspective view showing a crush rib of the other embodiment.
Figure 8B:
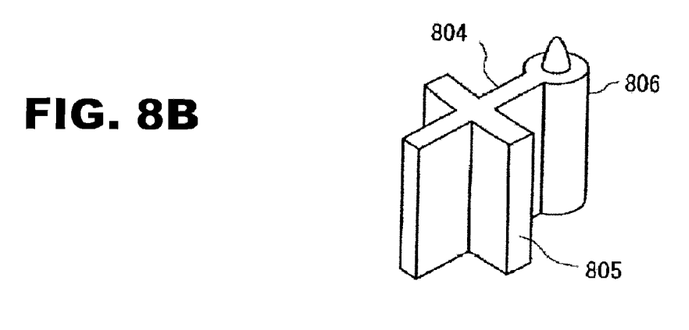
FIG. 8B is a perspective view showing a crush rib of the other embodiment.

Also only the thin plate body parts 41b, 42b could be possible. Or, one orthogonal part is provided at the body parts 41b, 42b, then as shown in FIG. 8A, a crush rib having a T-shape in cross section which is formed by a column portion 801, a body part 802 and an orthogonal part 803 could be formed. Further, as shown in FIG. 8B, a crush rib having such shape that a body part 804 and an orthogonal part 805 form a cross and a column portion 806 is formed integrally with the body part 804 could be possible.

In the embodiment 1, as the body part guide portion, the groove shaped body part guide portion is shown. However, it is not limited to the groove shaped body part guide portion as long as the body part guide portion can guide the body part. For example, a body part guide portion formed by combining a hole and a plurality of protrusions might be used.

Likewise, as the orthogonal part guide portion, although the orthogonal part guide hole and the orthogonal part guide groove are shown, it is not limited to these orthogonal part guide portions. An orthogonal part guide portion formed by combining a plurality of protrusions may be used.

Figure 9A:
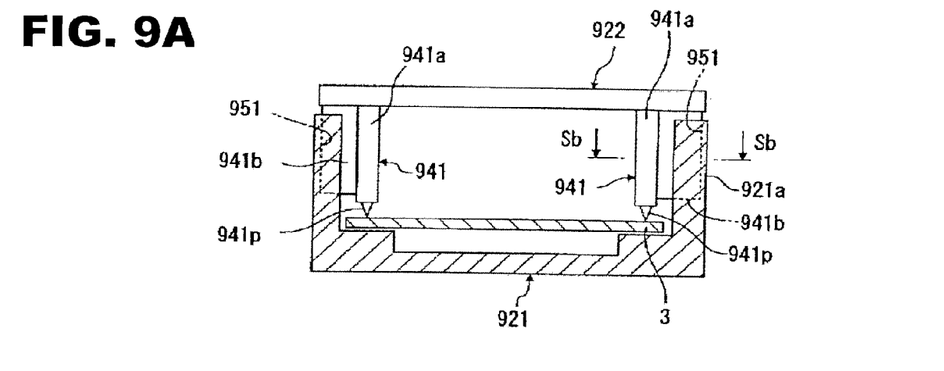
FIG. 9A is a sectional view, viewed from a side, showing a crush rib 941 and a guide groove 951 of the other embodiment.
Figure 9B:
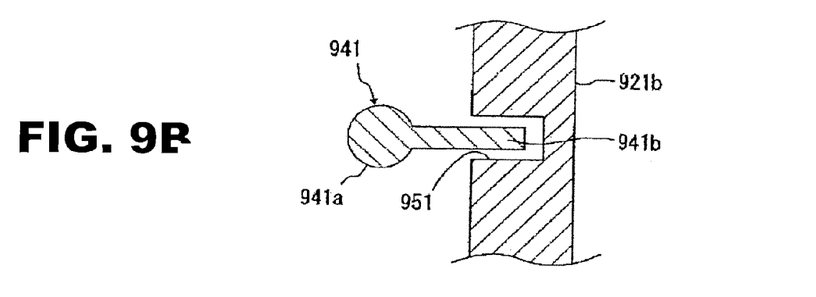
FIG. 9B is a sectional view, taken along a line Sb-Sb of FIG. 9A, showing the crush rib 941 and the guide groove 951 of the other embodiment.

Moreover, in the embodiment 1, as the crush rib, the crush rib having the orthogonal part is shown. However, as shown in FIGS. 9A and 9B, it could be possible to employ a structure of the crush rib in which a crush rib 941 has a cylindrical body column portion 941a and a body part 941b and does not have an orthogonal part. Additionally, a guide could also be formed so that the guide does not penetrate a circumferential wall 921b but has a depressed inside surface, like a guide groove 951 shown in FIGS. 9A and 9B. In this case, this has excellent sealing performance. Here, in the drawing, a reference sign 941p denotes the crush pin.

EXPLANATION OF REFERENCE 2 case
3 substrate
21 first case
21b circumferential wall
22 second case
22b circumferential wall
23 holding space section
41 first crush rib
41a body column portion
41b body part
41c first orthogonal part
41d second orthogonal part
41e sandwich gap portion
41p crush pin
42 second crush rib
42a body column portion
42b body part
42c orthogonal part
42p crush pin
51 first guide
51a body part guide groove (body part guide portion)
51b second orthogonal part guide hole (orthogonal part guide portion)
51c sandwiched part
52 second guide
521 guide groove
521a body part guide portion
521b orthogonal part guide portion

The invention claimed is:

1. A substrate support structure comprising:
a case having a first case and a second case, a holding space section that houses therein a substrate being formed in the case;
a crush rib provided in the second case and having a thin plate body part, a crush pin provided at a top of a columnar portion of the crush rib in an axial direction of the columnar portion, and an orthogonal part that extends from the body part in a direction substantially orthogonal to the body part, the crush rib pressing and fixing the substrate to the first case by a reaction force that is generated by the crush rib being pressed against the substrate and crushed when the first and second cases are joined together; and
a guide provided in the first case and having a body part guide portion that guides the body part while restraining relative movement in a thickness direction of the body part and an orthogonal part guide portion that is substantially orthogonal to the body part guide portion and guides the orthogonal part while restraining relative movement in a thickness direction of the orthogonal part, the guide guiding the crush rib to the substrate mounted in the first case when the first case and the second case are joined together.

2. The substrate support structure as claimed in claim 1, wherein:
the crush rib and the guide are provided in middle portions of the second case and the first case respectively, which are away from a circumferential wall that encloses the holding space section.

3. The substrate support structure as claimed in claim 1, wherein:
at least a pair of crush ribs and at least a pair of guides are provided, and each pair of crush ribs and each pair of guides are positioned at diagonal corners of the substrate, which are symmetrical about a center of the substrate.

4. The substrate support structure as claimed in claim 1, wherein:
   a motor is mounted in the holding space section, and at least a pair of crush ribs and at least a pair of guides are respectively provided in diagonal positions with respect to a center of the substrate.

5. A substrate support structure comprising:
   a case having a first case and a second case, a holding space section that houses therein a substrate being formed in the case,
   a crush rib provided in the second case and having a thin plate body part and an orthogonal part that extends from the body part in a direction substantially orthogonal to the body part, the crush rib pressing and fixing the substrate to the first case by a reaction force that is generated by the crush rib being pressed against the substrate and crushed when the first and second cases are joined together; and
   a guide provided in the first case and having a body part guide portion that guides the body part while restraining relative movement in a thickness direction of the body part and an orthogonal part guide portion that is substantially orthogonal to the body part guide portion and guides the orthogonal part while restraining relative movement in a thickness direction of the orthogonal part, the guide guiding the crush rib to the substrate mounted in the first case when the first case and the second case are joined together, wherein:
   the crush rib has a pair of orthogonal parts that form a substantially H-shape in cross section together with the body part, and
   the guide is provided with a sandwiched part that is sandwiched and supported between and by the pair of orthogonal parts.

6. A substrate support structure comprising:
   a case having a first case and a second case, a holding space section that houses therein a substrate being formed in the case;
   a crush rib provided in the second case and having a thin plate body part and an orthogonal part that extends from the body part in a direction substantially orthogonal to the body part, the crush rib pressing and fixing the substrate to the first case by a reaction force that is generated by the crush rib being pressed against the substrate and crushed when the first and second cases are joined together; and
   a guide provided in the first case and having a body part guide portion that guides the body part while restraining relative movement in a thickness direction of the body part and an orthogonal part guide portion that is substantially orthogonal to the body part guide portion and guides the orthogonal part while restraining relative movement in a thickness direction of the orthogonal part, the guide guiding the crush rib to the substrate mounted in the first case when the first case and the second case are joined together, wherein:
   the first case has the holding space section in which the substrate is mounted,
   the crush rib protrudes toward the first case in the second case,
   the guide is formed in a position where the crush rib is inserted, in the first case, and
   when the first and second cases are joined together, the crush rib is inserted into the guide and is guided up to the substrate before entering the holding space section of the first case.

* * * * *